(12) United States Patent
Ichinohe et al.

(10) Patent No.: US 11,309,231 B2
(45) Date of Patent: Apr. 19, 2022

(54) SEMICONDUCTOR DEVICE

(71) Applicant: Mitsubishi Electric Corporation, Tokyo (JP)

(72) Inventors: Hiroaki Ichinohe, Tokyo (JP); Katsumi Miyawaki, Tokyo (JP); Takao Moriwaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 159 days.

(21) Appl. No.: 16/462,503

(22) PCT Filed: Feb. 21, 2017

(86) PCT No.: PCT/JP2017/006412
§ 371 (c)(1),
(2) Date: May 20, 2019

(87) PCT Pub. No.: WO2018/154635
PCT Pub. Date: Aug. 30, 2018

(65) Prior Publication Data
US 2021/0175150 A1 Jun. 10, 2021

(51) Int. Cl.
*H01L 23/433* (2006.01)
*H01L 23/31* (2006.01)
(Continued)

(52) U.S. Cl.
CPC .......... *H01L 23/4334* (2013.01); *H01L 23/31* (2013.01); *H01L 23/367* (2013.01);
(Continued)

(58) Field of Classification Search
CPC ... H01L 23/4334; H01L 24/48; H01L 23/367; H01L 23/31; H01L 23/49568;
(Continued)

(56) References Cited

U.S. PATENT DOCUMENTS

| 5,722,161 A | 3/1998 | Marrs |
| 2007/0052088 A1* | 3/2007 | Tsurume ............... H01L 23/367 257/707 |

(Continued)

FOREIGN PATENT DOCUMENTS

| JP | H10-022418 A | 1/1998 |
| JP | 2006-049698 A | 2/2006 |

(Continued)

OTHER PUBLICATIONS

JP 2015-164165, IDS reference of record (Year: 2015).*
(Continued)

*Primary Examiner* — Patricia D Reddington
(74) *Attorney, Agent, or Firm* — Studebaker & Brackett PC

(57) ABSTRACT

A semiconductor device includes a heat sink, a semiconductor chip and a circuit board that are fixed to the heat sink with a fixing material, plural leads connected to the semiconductor chip and the circuit board via wires, and mold resin provided on the heat sink. The mold resin covers parts of the leads, the wires, and the semiconductor chip, and exposes remainders of the leads. The surfaces of the leads and the heat sink are provided with roughened plating having a surface roughness RMS=150 nm or more. The fixing material is solder or sintered silver. The water absorption rate of the mold resin is 0.24% or less.

14 Claims, 4 Drawing Sheets

A-A' Section

(51) Int. Cl.
*H01L 23/367* (2006.01)
*H01L 23/373* (2006.01)
*H01L 23/495* (2006.01)
*H01L 23/00* (2006.01)

(52) U.S. Cl.
CPC ...... *H01L 23/373* (2013.01); *H01L 23/49568* (2013.01); *H01L 24/48* (2013.01); *H01L 23/3142* (2013.01); *H01L 23/49582* (2013.01); *H01L 2224/48091* (2013.01); *H01L 2224/48137* (2013.01); *H01L 2924/181* (2013.01)

(58) Field of Classification Search
CPC .............. H01L 23/373; H01L 2924/181; H01L 2224/48137; H01L 2224/48091; H01L 23/49582; H01L 23/3142
See application file for complete search history.

(56) References Cited

U.S. PATENT DOCUMENTS

| | | | |
|---|---|---|---|
| 2007/0200258 | A1 | 8/2007 | Mahler et al. |
| 2008/0145607 | A1 | 6/2008 | Kajiwara et al. |
| 2009/0039486 | A1 | 2/2009 | Shimazaki et al. |
| 2016/0289443 | A1 | 10/2016 | Iwatani et al. |
| 2017/0345744 | A1* | 11/2017 | Olsen ................ H01L 23/49503 |
| 2018/0282494 | A1* | 10/2018 | Otake ..................... C08K 3/36 |

FOREIGN PATENT DOCUMENTS

| | | |
|---|---|---|
| JP | 2008-153470 A | 7/2008 |
| JP | 2012-111999 A | 6/2012 |
| JP | 2015-164165 A | 9/2015 |
| WO | 2016/104196 A1 | 6/2016 |
| WO | 2016/157259 A1 | 10/2016 |

OTHER PUBLICATIONS

International Search Report; Written Opinion; and Notification of Transmittal of the International Search Report and the Written Opinion of the International Searching Authority, or the Declaration issued in PCT/JP2017/006412; dated May 16, 2017.

Quinn Martin; "High Power Plastic Packaging with GaN"; IEEE IMS 2015 Work Shop; May 17-22, 2015; pp. 1-7.

Office Action issued in JP 2017-533648; mailed by the Japanese Patent Office dated Oct. 3, 2017.

Office Action issued in JP 2017-533648; mailed by the Japanese Patent Office dated Feb. 27, 2018.

An Office Action mailed by the Korean Intellectual Property Office dated Aug. 4, 2020, which corresponds to Korean Patent Application No. 10-2019-7023915 and is related to U.S. Appl. No. 16/462,503.

An Office Action mailed by the German Patent Office dated Feb. 4, 2022, which corresponds to German Patent Application No. 11 2017 007 098.8 and is related to U.S. Appl. No. 16/462,503.

* cited by examiner

A-A' Section

Enlarged view of X portion

B-B' Section

SEMICONDUCTOR DEVICE

FIELD

The present application relates to a semiconductor device.

BACKGROUND

Conventionally, for example, as disclosed in JP 2015-164165 A, a semiconductor device in which a semiconductor chip formed of a wide bandgap semiconductor material such as GaN is sealed with mold resin has been known. A semiconductor chip capable of operating at a high temperature is provided by using a wide bandgap semiconductor having a bandgap larger than the bandgap of silicon. In order to realize a mold package structure adaptable to a high temperature operation, it is necessary to select mold resin which can withstand the high temperature operation. With respect to this point, a numerical value of 195° C. or more is described as a preferable value of the glass transition temperature Tg of the mold resin in paragraph [0023] of the above-described PTL 1. Furthermore, it is also described in paragraph [0014] of the above-described PTL 1 that a semiconductor chip is bonded to a heat block by using a sintered silver joint body so as to withstand the high temperature operation of the semiconductor chip.

CITATION LIST

Patent Literature

[PTL 1] JP 2015-164165 A

SUMMARY

Technical Problem

However, as a result of earnest studies by the inventor of the present application, it has been found that the structure described in the above-mentioned PTL 1 causes a problem that the resin peels off a heat sink in a moisture absorption reflow test. When this resin peeling problem is not solved, it causes a problem that it is impossible to perform reflow mounting on a semiconductor device and thus an advantage of a resin package structure cannot be utilized.

The present application has been made to solve the above-described problem, and has an object to provide a semiconductor device that has a resin-sealed type package structure capable of operating at a high temperature and is improved to suppress resin peeling in a reflow step.

A semiconductor device according to the present application includes:

a heat sink;

a semiconductor chip fixed to the heat sink with a fixing material;

a lead connected to the semiconductor chip via a wire; and mold resin that is provided on the heat sink so as to cover a part of the lead, the wire, and the semiconductor chip and has a glass transition temperature of 195° C. or more, wherein roughened plating having a surface roughness of RMS=150 nm or more is provided on a surface overlapping the mold resin in the heat sink and a surface overlapping the mold resin in the lead, the fixing material is solder or sintered silver, and a water absorption rate of the mold resin is 0.24% or less.

Advantageous Effect

According to the structure of the present application, it has been newly discovered by the inventor of the present application that resin peeling during reflow mounting can be suppressed even by using mold resin having a high glass transition temperature. Therefore, it is possible to provide a resin-sealed type semiconductor device in which resin peeling in the reflow step is suppressed and high-temperature operation can be performed.

DESCRIPTION OF EMBODIMENT

Figure 1:
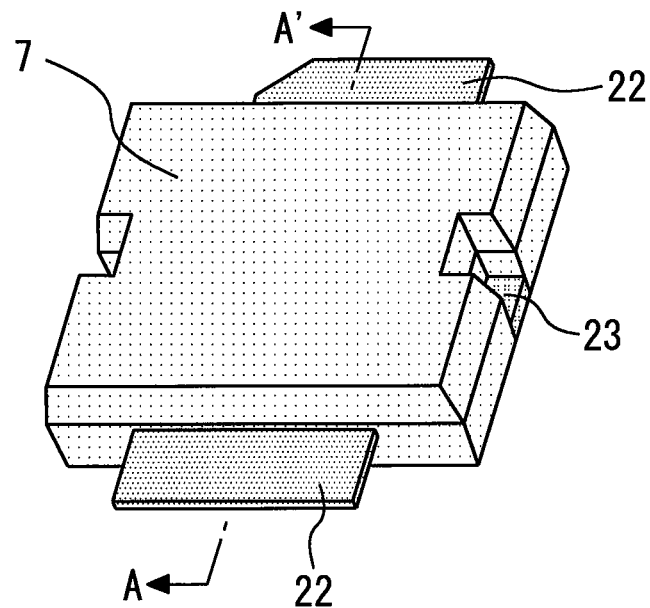
FIG. 1 is a perspective view showing an external appearance of a semiconductor device according to an embodiment of the present embodiment.
Figure 2:
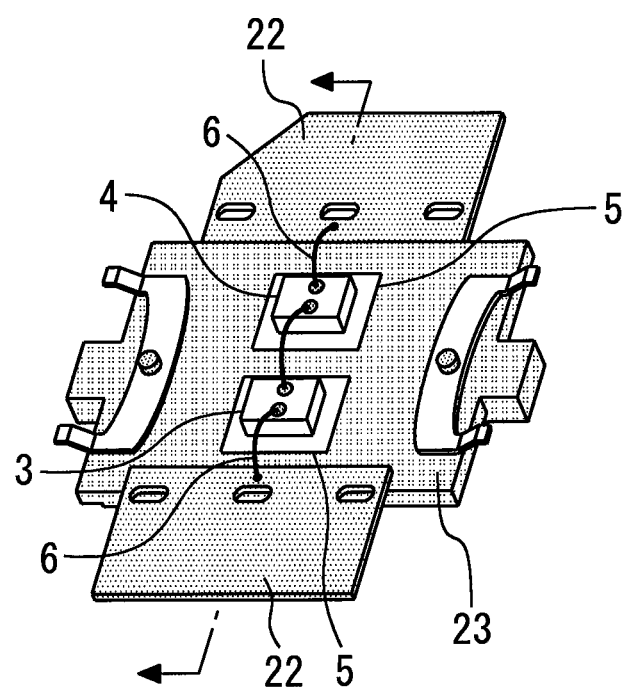
FIG. 2 is a perspective view showing an internal structure of the semiconductor device according to the embodiment of the present embodiment.

FIG. 1 is a perspective view showing an external appearance of a semiconductor device 1 according to an embodiment of the present embodiment. As shown in FIG. 1, the semiconductor device 1 includes mold resin 7 provided on a heat sink 23 and leads 22 protruding from the mold resin 7. FIG. 2 is a perspective view showing an internal structure of the semiconductor device 1 according to the embodiment of the present embodiment. As shown in FIG. 2, the semiconductor device 1 includes the heat sink 23, a semiconductor chip 3 and a circuit board 4 which are fixed to the heat sink 23 with fixing materials 5, and plural leads 22 which are connected to the semiconductor chip 3 and the circuit board 4 via wires 6. As is apparent from FIGS. 1 and 2, the mold resin 7 covers parts of the leads 22, the wires 6, and the semiconductor chip 3, and exposes the remainders of the leads 22.

The semiconductor device 1 is a resin package and can be subjected to reflow mounting. As one example, a thermal stress during reflow mounting is 260° C. in peak temperature and 30 seconds or less in time. The semiconductor device 1 is improved so that peeling of the mold resin 7 from the heat sink 23 and the leads 22 does not occur even when such a thermal stress is applied.

Figure 3:
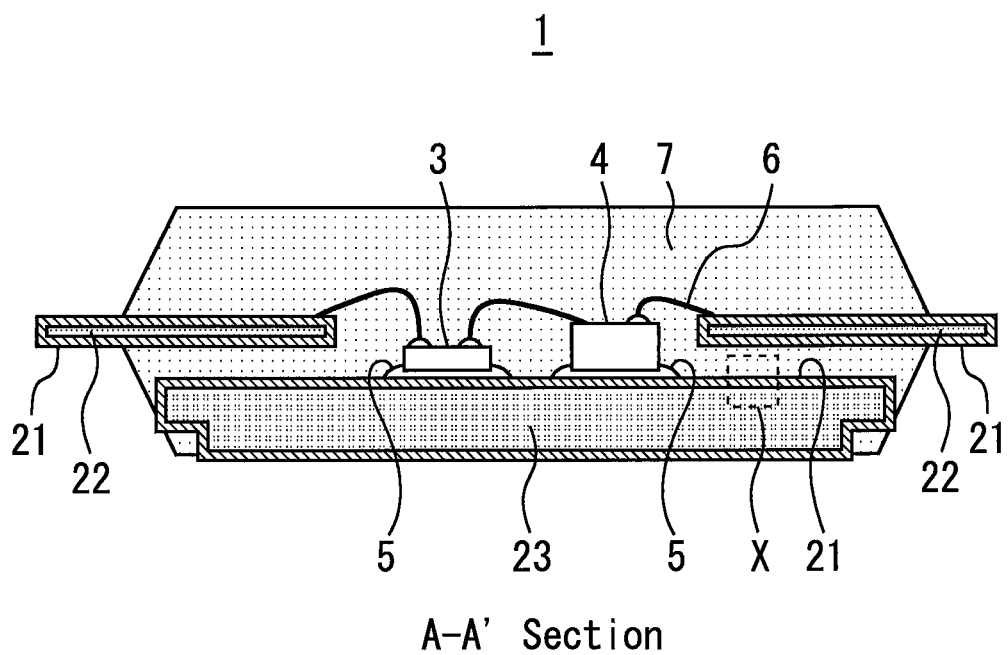
FIG. 3 is a cross-sectional view showing the semiconductor device according to the embodiment of the present embodiment.
Figure 4:
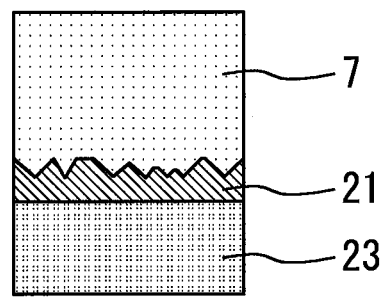
FIG. 4 is a partially enlarged view showing the semiconductor device according to the embodiment of the present embodiment.

FIG. 3 is a cross-sectional view showing the semiconductor device 1 according to the embodiment of the present embodiment. FIG. 3 is a cross-sectional view taken when the semiconductor device 1 is cut along a line A-A' of FIGS. 1 and 2. FIG. 4 is a partially enlarged view showing the semiconductor device 1 according to the embodiment of the present embodiment. FIG. 4 is an enlarged view of an X portion of FIG. 3.

A roughened plating 21 having a surface roughness RMS=150 nm or more is provided on the entire surface of the heat sink 23. The roughened plating 21 is also provided on the entire surfaces of the leads 22. Note that the roughened plating 21 may be provided at least on surfaces of the heat sink 23 and the leads 22 which overlap the mold resin 7. Accordingly, the roughened plating 21 may not be provided on portions of the heat sink 23 and the leads 22 which are exposed from the mold resin 7. The heat sink 23 and the leads 22 are formed of copper. Copper has a high thermal conductivity of 398 W/mK. With respect to materials of the heat sink 23 and the leads 22, various modifications are possible as described later, but from the viewpoint of obtaining high heat dissipation performance, it is preferable that the heat sink 23 and the leads 22 are formed of materials having a thermal conductivity of 200 W/mK or more.

The semiconductor device 1 is a high-frequency high-output semiconductor device which operates at a frequency of 1 GHz or more and outputs power of 1 W or more. The semiconductor chip 3 incorporated in the semiconductor device 1 is formed of gallium nitride (GaN). The GaN semiconductor device can operate at a higher temperature than a silicon (Si) semiconductor device and a gallium arsenide (GaAs) semiconductor device which have been conventionally used for high frequency semiconductor devices. Specifically, the junction temperature of the semiconductor chip 3 during operation of the semiconductor device 1 is 250° C. or more. In the embodiment, as an example, the semiconductor device 1 is a wireless communication semiconductor device. The semiconductor device 1 may be a base station for portable phones which is one of wireless communication semiconductor devices. In a field directing to high power output out of technical fields relating to wireless communication semiconductor devices, there is a demand broadening the band due to increase in communication capacity and miniaturizing semiconductor devices, and GaN semiconductor devices have been mainly used. The semiconductor device 1 can satisfy these broadening of the band and miniaturization. Furthermore, as compared with conventional GaN semiconductor devices to which a screw-type metal base package structure and a ceramic package structure have been applied, the semiconductor device 1 according to the embodiment has a resin package structure, so that the cost can be reduced.

The semiconductor chip 3 and the circuit board 4 are fixed to the surface of the heat sink 23 by the fixing material 5. The fixing material 5 is solder or sintered silver. As compared with silver paste resin, solder and sintered silver are harder to absorb moisture and have better thermal conductivity.

The mold resin 7 seals the semiconductor chip 3 and the circuit board 4 in order to protect the semiconductor chip 3 and the circuit board 4 from foreign matter and external force or the like. The glass transition temperature of the mold resin 7 is 195° C. or more. The water absorption rate of the mold resin 7 is 0.24% or less. More specifically, it is assumed in the embodiment that the mold resin 7 has a glass transition temperature of 200° C., a thermal decomposition starting temperature of 300° C., a water absorption rate of 0.24%, and a coefficient of linear expansion of 9 to 19 ppm.

Since the semiconductor chip 3 is formed of GaN, there is a risk of failure when the temperature rises up to a temperature around 300° C. However, this means that the semiconductor chip 3 operates in a high temperature state near to 300° C. as long as it stays in a range that does not cause failures. The thermal decomposition starting temperature of the mold resin 7 is set to 300° C. or more, so that it is possible to ensure that the mold resin 7 is not thermally decomposed even in the vicinity of the upper limit of the high temperature operation of the semiconductor chip 3.

The inventor of the present application has found that the following first countermeasure to third countermeasure are effective to suppress resin peeling during reflow mounting in a semiconductor device using mold resin having a high glass transition temperature.

The first countermeasure is to lower the water absorption rate of the material itself of the mold resin 7. Thermosetting resin containing epoxy resin and an inorganic filler can be used as a material of the mold resin 7. The mold resin 7 is provided by thermally curing thermosetting resin. One of physical property values of the mold resin 7 is the glass transition temperature (Tg). The epoxy resin contained in the mold resin 7 is selected so that the mold resin 7 has a high glass transition temperature and a high thermal decomposition starting temperature so as to withstand the high temperature operation of the semiconductor device 1. However, in general, the water absorption rate of the conventional mold resin materials also tends to increase due to the molecular structure of the epoxy resin when the glass transition temperature is high. One cause of mold resin peeling resides in that moisture inside the package is vaporized during reflow mounting. When resin having a high glass transition temperature is merely selected, it causes the water absorption rate to increase, so that resin peeling occurs due to thermal stress during reflow mounting.

By the way, according to a recently developed technology, mold resin materials which have high glass transition temperatures, but keep water absorption rates thereof low are beginning to be provided by controlling the molecular structure of epoxy resin. Therefore, the inventor of the present application has focused on such technical trends and conducted an experiment by using mold resin materials having high glass transition temperatures and reduced water absorption rates. Based on experimental results shown in Tables 1 to 3 described later, it has been found that when the water absorption rate is suppressed to 0.24% or less, it is possible to suppress resin peeling during reflow mounting by combining with the second countermeasure and the third countermeasure described later. Note that according to the experimental results, when the water absorption rate exceeds 0.24%, there is a risk that partial peeling occurs during reflow mounting, and when the water absorption rate is 0.30% or more, full peeling occurs.

The second countermeasure resides in that materials which easily absorb water are not put inside the mold resin 7. The semiconductor chip 3 and the circuit board 4 are die-bonded to the heat sink 23 with the fixing material 5 inside the mold resin 7. In the semiconductor device 1, this fixing material 5 is solder or sintered silver. When a die-bonding material such as silver paste resin is used, the mold resin 7 is peeled off during reflow mounting of the semiconductor device 1 due to moisture absorbed by epoxy resin contained in the silver paste resin. In this regard, since the semiconductor chip 3 and the like are fixed by solder or sintered silver in the semiconductor device 1 according to the embodiment, the moisture in the mold resin 7 can be suppressed.

The third measure resides in that the adhesion strength between the mold resin and the heat sink is sufficiently enhanced. In the semiconductor device 1, the adhesion strength between the mold resin 7 and each of the heat sink 23 and the leads 22 is enhanced by an anchor effect because of provision of the roughened plating 21. It has been found by an experiment of the inventor of the present application that the surface roughness of the roughened plating 21 is required to be 150 nm or more in RMS value (Root-mean-square). The surface roughness in the embodiment is an RMS value measured with an atomic force microscope (AFM). The RMS value is a square root of the mean value of the square values of deviations from a mean value.

It has been clarified by the experiments of the inventor of the present application that the resin peeling between the mold resin 7 and each of the heat sink 23 and the like during reflow mounting can be suppressed by combining all the first countermeasure to the third countermeasure.

Note that as a more preferable incidental countermeasure relating to the selection of the material of the mold resin 7, an improvement may be made to sufficiently reduce the difference in coefficient of linear expansion between the mold resin 7 and each of the heat sink 23 and the leads 22. Since the coefficient of linear expansion of copper is about 17 ppm, the material components of the mold resin 7 may be adjusted so that the coefficient of linear expansion in an al region of the mold resin 7 at the glass transition temperature or less is in a range of 9 to 19 ppm. As a result, stress occurring in the mold resin 7 can be reduced, and the resin peeling can be suppressed.

The experimental results carried out by the inventor of the present application will be described with reference to the following Tables 1 to 3. Tables 1 to 3 show the results of the moisture absorption reflow test of samples among which the surface roughness, bonding materials, and the water absorption rate of the mold resin were made different. The test condition is set to Lv. 3 of Jedec.

Table 1 shows a result of the test carried out with the first molding resin having a glass transition temperature Tg=208 and a coefficient of linear expansion=12 ppm. As shown in Table 1, when the water absorption rate of the first mold resin was 0.3%, peeling occurred after the moisture absorption reflow test regardless of the combination of the surface roughness of the roughened plating and the bonding material.

TABLE 1

| Surface roughness (RMS) | Bonding material | Water absorption rate of mold resin | Peeling or no peeling after moisture absorption reflow test |
|---|---|---|---|
| 50 nm | Silver paste resin Solder Sintered silver | 0.3% | Peeling (full peeling) |
| 100 nm | Silver paste resin Solder Sintered silver | | |
| 150 nm | Silver paste resin Solder Sintered silver | | |
| 200 nm | Silver paste resin Solder Sintered silver | | |
| 250 nm | Silver paste resin Solder Sintered silver | | |

Table 2 shows A result of the test carried out with the second mold resin having a glass transition temperature Tg=195 and a coefficient of linear expansion=10 ppm. As shown in Table 2, when the water absorption rate of the second mold resin was 0.27%, peeling occurred after the moisture absorption reflow test. However, partial peeling occurred in a sample in which the surface roughness was in a range of 150 nm to 250 nm and solder or sintered silver was used as the bonding material.

TABLE 2

| Surface roughness (RMS) | Bonding material | Water absorption rate of mold resin | Peeling or no peeling after moisture absorption reflow test |
|---|---|---|---|
| 50 nm | Silver paste resin Solder Sintered silver | 0.27% | Peeling (full peeling) |
| 100 nm | Silver paste resin Solder Sintered silver | | |
| 150 nm | Silver paste resin Solder Sintered silver | | Peeling (full peeling) Peeling (partial peeling) |
| 200 nm | Silver paste resin Solder Sintered silver | | Peeling (full peeling) Peeling (partial peeling) |
| 250 nm | Silver paste resin Solder Sintered silver | | Peeling (full peeling) Peeling (partial peeling) |

Table 3 shows a result of the test carried out with the third mold resin having a glass transition temperature Tg=195 and a coefficient of linear expansion=12 ppm. As shown in Table 3, when the water absorption rate of the third mold resin was 0.24%, no peeling occurred in a sample in which the surface roughness was in a range of 150 nm to 250 nm and solder or sintered silver was used as the bonding material.

TABLE 3

| Surface roughness (RMS) | Bonding material | Water absorption rate of mold resin | Peeling or no peeling after moisture absorption reflow test |
|---|---|---|---|
| 50 nm | Silver paste resin Solder Sintered silver | 0.24% | Peeling (full peeling) |
| 100 nm | Silver paste resin Solder Sintered silver | | |
| 150 nm | Silver paste resin Solder Sintered silver | | Full peeling No peeling No peeling |
| 200 nm | Silver paste resin Solder Sintered silver | | Full peeling No peeling No peeling |
| 250 nm | Silver paste resin Solder Sintered silver | | Full peeling No peeling No peeling |

The semiconductor device 1 according to the embodiment can be variously modified as described below.

It is preferable that the surface roughness of the roughened plating 21 is in a range of RMS=150 nm to 250 nm. When RMS=150 nm or less, the adhesion strength is insufficient and resin peeling occurs during reflow mounting. Also, when RMS=250 nm or more, it is difficult to remove a plating solution residue by washing due to an influence of roughening. When a stain and discoloration occur on the plating surface due to an influence of the plating solution residue, non-adhesion of wires occurs. From these points, it is desirable that the surface roughness is in a range of RMS=150 nm to 250 nm when measured by an atomic force microscope (AFM). This makes it possible to prevent the plating solution residue from being difficult to be washed and removed from the heat sink 23 and the leads 22. However, if only an effect of suppressing resin peeling is taken into consideration, the surface roughness may be larger than 250 nm.

The thermal decomposition starting temperature of the mold resin 7 may be less than 300° C. The thermal decomposition starting temperature of the mold resin 7 may be a low temperature less than 300° C. insofar as it is certain from the specification of the semiconductor device 1 that the operating temperature of the semiconductor chip 3 does not reach a high temperature around 300° C.

The semiconductor chip 3 which is a high frequency semiconductor device may be specifically a high-power amplifier, HEMT, MOSFET, or the like, for example. Furthermore, the semiconductor device 1 is not limited to one that outputs electric power with a frequency of 1 GHz or more and 1 W or more. The semiconductor device 1 may be a high frequency semiconductor device having a frequency of less than 1 GHz or may have an output power of less than 1 W.

The material of the semiconductor chip 3 is not limited to gallium nitride (GaN). A wide bandgap semiconductor material such as silicon carbide (SiC) or diamond may be used. Furthermore, according to the semiconductor device 1, there is an effect of suppressing peeling of the mold resin 7 during reflow mounting while using the mold resin 7 having a high glass transition temperature, and this effect can be obtained regardless of the semiconductor material of the semiconductor chip 3. Therefore, it is not necessary to use a wide bandgap semiconductor material, and the material of the semiconductor chip 3 may be silicon (Si) or gallium arsenide (GaAs).

The materials of the heat sink 23 and the leads 22 are not limited to copper. As the materials of the heat sink 23 and the leads 22, copper alloy and aluminum can also be used. Alloy of copper and molybdenum may be used as the copper alloy used as the materials of the heat sink 23 and the leads 22. The composition of the copper alloy may be Cu/PCM/Cu. "Cu/PCM(Cu—Mo)/Cu" is a clad material of a three-layer structure in which Cu is made to adhere to both surfaces of Cu—Mo as a core material. The copper alloy used as the materials of the heat sink 23 and the leads 22 may be alloy of copper and tungsten. Note that the materials of the heat sink 23 and the leads 22 may be the same or different.

It is preferable that the heat sink 23 and the leads 22 are formed of a material having a thermal conductivity of 200 W/mK or more. This makes it possible to exhibit good heat dissipation when the semiconductor chip 3 operates at a high temperature. The thermal conductivity of copper is about 400 W/mK. The thermal conductivity of the copper molybdenum alloy (copper 35%, molybdenum 70%) is 200 W/mK, and the thermal conductivity can be made higher than 200 W/mK by making the percentage of copper higher than 35% and making molybdenum less than 70%. The thermal conductivity of the copper tungsten alloy (copper 20%, tungsten 80%) is 200 W/mK, and the thermal conductivity of the copper tungsten alloy (copper 11%, tungsten 89%) is 200 W/mK or more. The thermal conductivity of aluminum is 200 W/mK or more. However, when required heat dissipation performance is not severe, it may be formed of a material having a thermal conductivity of 200 W/mK or less.

It is preferable that the coefficient of linear expansion of the mold resin 7 is 9 to 19 ppm. This point will be described, and firstly, the coefficient of linear expansion of copper is about 17 ppm. The difference in coefficient of linear expansion between the heat sink 23 formed of copper and the mold resin 7 according to the embodiment is suppressed to 8 ppm or less. Furthermore, the coefficient of linear expansion of copper molybdenum alloy to be applied to the heat sink is in a range of 7 to 11.5 ppm. The difference in the coefficient of linear expansion between the heat sink 23 modified with the copper molybdenum alloy and the mold resin 7 is suppressed to 12 ppm or less. The coefficient of linear expansion of copper tungsten alloy to be applied to the heat sink is in a range of 6 to 8.3 ppm. The difference in coefficient of linear expansion between the heat sink 23 modified with the copper tungsten alloy and the mold resin 7 is suppressed to 13 ppm or less. The coefficient of linear expansion of aluminum is about 24 ppm. The difference in coefficient of linear expansion between the heat sink 23 modified with aluminum and the mold resin 7 is suppressed to 15 ppm or less. As a result, it is possible to suppress peeling of the mold resin 7 while providing the heat sink 23 with high heat dissipation performance.

Figure 5:
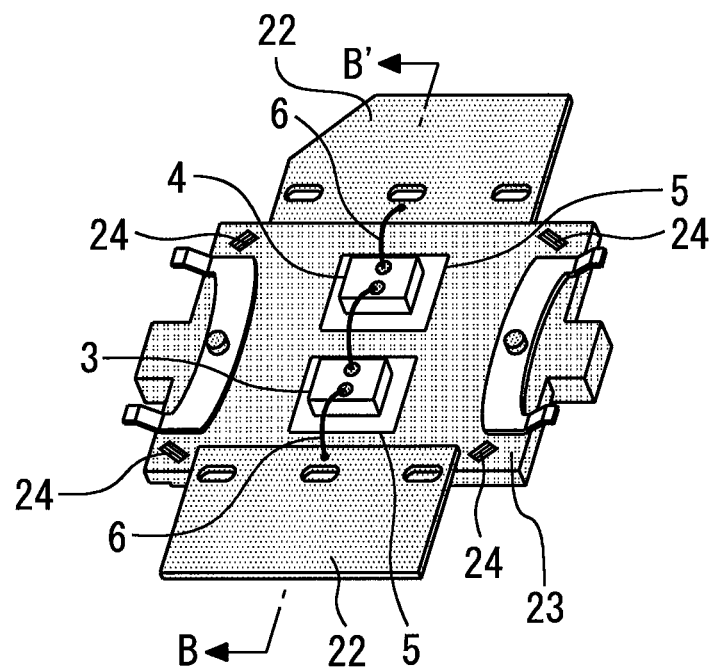
FIG. 5 is a diagram showing an internal structure of a modification of the semiconductor device according to the embodiment of the present embodiment.
Figure 6:
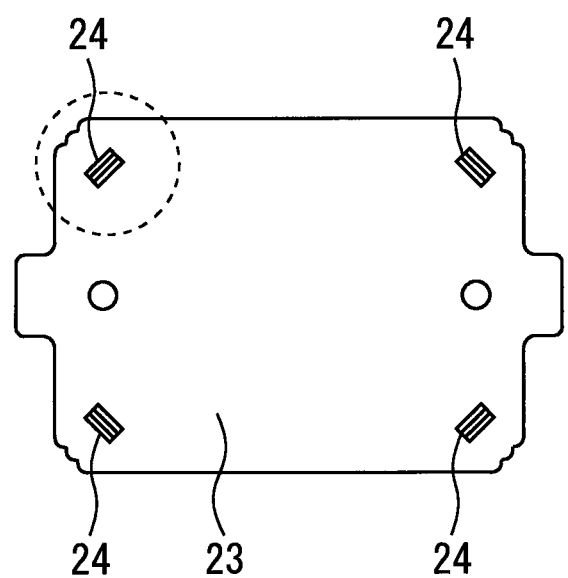
FIG. 6 is a plan view showing a heat sink included in the modification of the semiconductor device according to the embodiment of the present embodiment.
Figure 7:
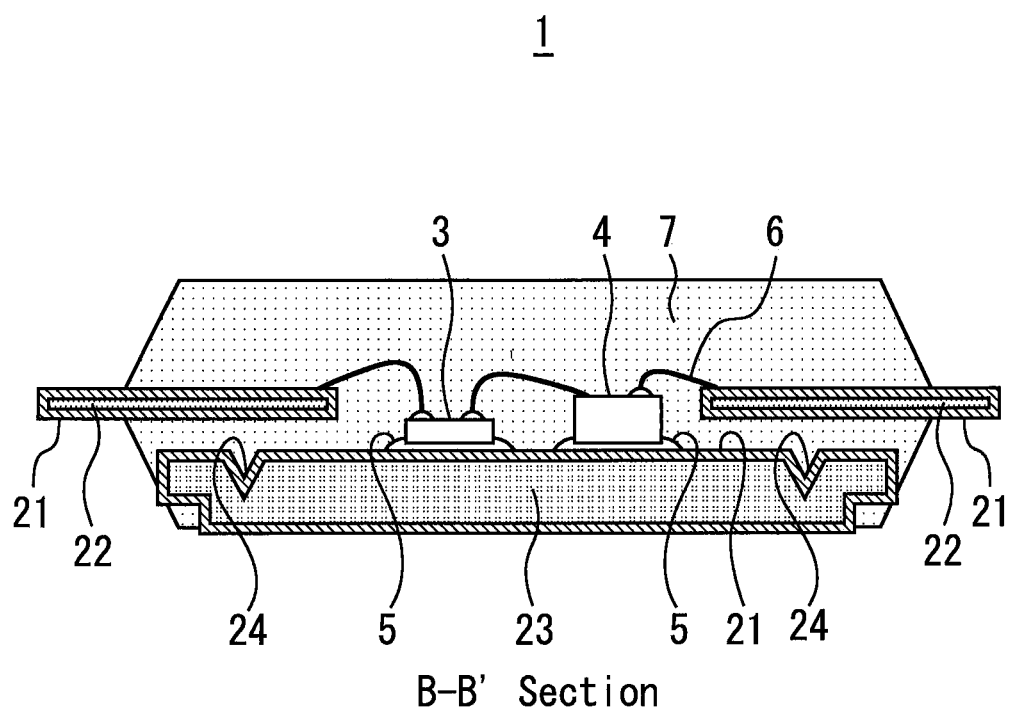
FIG. 7 is a cross-sectional view showing the modification of the semiconductor device according to the embodiment of the present embodiment.

FIG. 5 is a diagram showing an internal structure of a modification of the semiconductor device 1 according to the embodiment of the present embodiment. Although the mold resin 7 is not shown in FIG. 5, in this modification, the mold resin 7 also covers the heat sink 23 and the like as in the case of FIG. 1. FIG. 6 is a plan view showing a heat sink 23 included in the modification of the semiconductor device 1 according to the embodiment of the present embodiment. FIG. 7 is a cross-sectional view showing the modification of the semiconductor device 1 according to the embodiment of the present embodiment. FIG. 7 shows a cross-section of the semiconductor device 1 taken along a line B-B' of FIG. 5, and the mold resin 7 is also shown in FIG. 7. In the modification shown in FIGS. 5 to 7, grooves 24 are provided at the four corners of the surface of the heat sink 23 so as to surround the semiconductor chip 3. Each of the grooves 24 in the four corners may be a plurality of grooves or a single groove. It is preferable that the depth of the groove 24 is 50 μm or more, and it is preferable that the length of the groove 24 is 1 mm or more. As shown in FIG. 7, the cross-sectional shape of the groove 24 may be a V-shape, a U-shape, an inverted trapezoid shape, or the like. According to the present modification, even when resin peeling occurs between the mold resin 7 and the heat sink 23 or the like due to reflow or the like, a peeling developing direction of the mold can be changed by the grooves 24. As a result, it is possible to prevent peeling of the mold resin 7 from developing to a region where the semiconductor chip 3 and the circuit board 4 are mounted.

REFERENCE SIGNS LIST 1 semiconductor device
3 semiconductor chip
4 circuit board
5 fixing material
6 wire
7 mold resin
22 lead
23 heat sink
24 groove

The invention claimed is:
1. A semiconductor device comprising:
a heat sink;
a semiconductor chip fixed to the heat sink with a fixing material;
a lead connected to the semiconductor chip via a wire; and
mold resin that is provided on the heat sink so as to cover
 a part of the lead, the wire, and the semiconductor chip and has a glass transition temperature of 195° C. or more, wherein
roughened plating having a surface roughness of RMS=150 nm or more is provided on a surface overlapping the mold resin in the heat sink and a surface overlapping the mold resin in the lead,
the fixing material is solder or sintered silver, a water absorption rate of the mold resin is 0.24% or less, and a surface roughness of the roughened plating is RMS=250 nm or less.

2. The semiconductor device according to claim 1, wherein the semiconductor chip is formed of a wide bandgap semiconductor material, and a thermal decomposition starting temperature of the mold resin is 300° C. or more.

3. The semiconductor device according to claim 1, wherein materials of the heat sink and the lead are copper, copper molybdenum alloy, copper tungsten alloy, or aluminum, and a coefficient of linear expansion of the mold resin is in a range of 9 to 19 ppm.

4. The semiconductor device according to claim 1, wherein the heat sink is formed of a material having a thermal conductivity of 200 W/mK or more.

5. The semiconductor device according to claim 1, wherein grooves extending so as to surround the semiconductor chip are provided at four corners of the surface of the heat sink.

6. A semiconductor device comprising:

a heat sink;

a semiconductor chip fixed to the heat sink with a fixing material;

a lead connected to the semiconductor chip via a wire; and mold resin that is provided on the heat sink so as to cover a part of the lead, the wire, and the semiconductor chip and has a glass transition temperature of 195° C. or more, wherein roughened plating having a surface roughness of RMS=150 nm or more is provided on a surface overlapping the mold resin in the heat sink and a surface overlapping the mold resin in the lead, the fixing material is solder or sintered silver, a water absorption rate of the mold resin is 0.24% or less, the semiconductor chip is formed of a wide bandgap semiconductor material, and a thermal decomposition starting temperature of the mold resin is 300° C. or more.

7. The semiconductor device according to claim 6, wherein materials of the heat sink and the lead are copper, copper molybdenum alloy, copper tungsten alloy, or aluminum, and a coefficient of linear expansion of the mold resin is in a range of 9 to 19 ppm.

8. The semiconductor device according to claim 6, wherein the heat sink is formed of a material having a thermal conductivity of 200 W/mK or more.

9. The semiconductor device according to claim 6, wherein grooves extending so as to surround the semiconductor chip are provided at four corners of the surface of the heat sink.

10. A semiconductor device comprising:

a heat sink;

a semiconductor chip fixed to the heat sink with a fixing material;

a lead connected to the semiconductor chip via a wire; and mold resin that is provided on the heat sink so as to cover a part of the lead, the wire, and the semiconductor chip and has a glass transition temperature of 195° C. or more, wherein roughened plating having a surface roughness of RMS=150 nm or more is provided on a surface overlapping the mold resin in the heat sink and a surface overlapping the mold resin in the lead, the fixing material is solder or sintered silver, a water absorption rate of the mold resin is 0.24% or less, materials of the heat sink and the lead are copper, copper molybdenum alloy, copper tungsten alloy, or aluminum, and a coefficient of linear expansion of the mold resin is in a range of 9 to 19 ppm.

11. The semiconductor device according to claim 10, wherein the heat sink is formed of a material having a thermal conductivity of 200 W/mK or more.

12. The semiconductor device according to claim 10, wherein grooves extending so as to surround the semiconductor chip are provided at four corners of the surface of the heat sink.

13. A semiconductor device comprising:

a heat sink;

a semiconductor chip fixed to the heat sink with a fixing material;

a lead connected to the semiconductor chip via a wire; and mold resin that is provided on the heat sink so as to cover a part of the lead, the wire, and the semiconductor chip and has a glass transition temperature of 195° C. or more, wherein roughened plating having a surface roughness of RMS=150 nm or more is provided on a surface overlapping the mold resin in the heat sink and a surface overlapping the mold resin in the lead, the fixing material is solder or sintered silver, a water absorption rate of the mold resin is 0.24% or less, and grooves extending so as to surround the semiconductor chip are provided at four corners of the surface of the heat sink.

14. The semiconductor device according to claim 13, wherein the heat sink is formed of a material having a thermal conductivity of 200 W/mK or more.

* * * * *